United States Patent [19]

Shirakawa et al.

[11] Patent Number: 6,012,388
[45] Date of Patent: Jan. 11, 2000

[54] SCREEN PRINTING METHOD AND SCREEN PRINTING APPARATUS

[75] Inventors: Yoshimi Shirakawa, Akashi; Shoichi Kawabe; Masaaki Sasaka, both of Miyazaki; Minoru Mikame, Kakogawa, all of Japan

[73] Assignee: Fujitsu Limited, Kawasaki, Japan

[21] Appl. No.: 09/042,849

[22] Filed: Mar. 17, 1998

[30] Foreign Application Priority Data

Jul. 4, 1997 [JP] Japan ..................................... 9-180180

[51] Int. Cl.$^7$ ....................................................... B41F 15/36
[52] U.S. Cl. ........................................ 101/127.1; 101/129
[58] Field of Search ................................ 101/127, 127.1, 101/128.1, 129

[56] References Cited

U.S. PATENT DOCUMENTS

| | | | |
|---|---|---|---|
| 4,776,271 | 10/1988 | Schlipf et al. | 101/129 |
| 5,063,842 | 11/1991 | Clarke | 101/127.1 |
| 5,162,008 | 11/1992 | Steiner et al. | 101/127.1 |
| 5,553,538 | 9/1996 | Freitag | 101/123 |

FOREIGN PATENT DOCUMENTS

| | | | |
|---|---|---|---|
| 102768 | 6/1983 | Japan | 101/127.1 |
| 3120047 | 5/1991 | Japan . | |
| 5154986 | 6/1993 | Japan . | |

OTHER PUBLICATIONS

English translation of Japanese Reference No. 58–102,768, of record.

*Primary Examiner*—Stephen R. Funk
*Attorney, Agent, or Firm*—Staas & Halsey LLP

[57] ABSTRACT

A screen printing method and apparatus for forming a predetermined pattern film, particularly phosphor material stripes for a plasma display panel, and which facilitates design of the screen mask and provides a measure for change of printing conditions, size error due to enlargement or reduction in size of the screen or change of specifications. The method prints printing material on a printing surface using a screen which is extended over a frame and has apertures corresponding to the printing pattern, and includes the steps of applying an external pressure to the frame from at least one side surface to deform the frame, and printing the printing material on the printing surface via the apertures under the condition that size of the apertures has been changed. The apparatus includes a screen having the apertures in the shape corresponding to the printing pattern, a frame for supporting the screen with a predetermined tension, and a device for applying pressure to at least one side surface of the frame.

37 Claims, 6 Drawing Sheets

SCREEN PRINTING METHOD AND SCREEN PRINTING APPARATUS

BACKGROUND OF THE INVENTION

1. Field of the Invention

The present invention relates to a screen printing method and apparatus which are suitable for formation of a fine pattern film of phosphor material, etc. in a color plasma display panel.

2. Description of the Related Art

A flat display apparatus, such as a color plasma display panel, is required to print fine pattern films, and usually relies upon phosphor material, separation walls and electrodes to generate accurate and high quality displays.

FIG. 1 shows a screen mask for explaining the screen printing method and printing apparatus of the related art. FIG. 1(a) is a perspective view, and FIG. 1(b) is a cross-sectional view taken along the line a–a' of FIG. 1(a).

As shown in FIGS. 1(a) and (b) screen printing is performed using a screen mask 31 in which a screen 33 having a plurality of apertures 33a formed therein in a stripe pattern corresponding to a print pattern is supported by a metal frame 32 with predetermined tension. This screen mask 31 is arranged to maintain a predetermined space for a printing object.

For example, in the case of printing a phosphor material of a color plasma display panel (hereinafter referred to as PDP), a glass substrate, having formed thereon a plurality of address electrodes, a dielectric material layer covering said address electrodes and a plurality of separation walls or stripes is positioned on the lower side of the screen mask 31 and is thereafter aligned with the apertures 33a of the screen 33 of the screen mask 31. The positioning is made so that narrow grooves or elongated cavities formed between the separation walls on the glass substrate oppose the aperture 33a stripes.

After such positioning, the phosphor material paste of the predetermined color, for example, red is applied onto the screen 33 of the screen mask 31 to fill the grooves between the predetermined separation walls on the glass substrate via the apertures 33a by sliding a squeegee on the screen 33.

After application of the red phosphor material paste, the grooves between the separation walls corresponding to green and blue are also filled with blue and green phosphor material pastes, respectively, in the same manner using screen masks with different aperture positions. Thereby, the printing of the phosphor materials can be completed.

With continued efforts to improve the display resolution and overall quality, a pitch of the grooves between the separation walls by which the phosphor materials are printed tends to become finer and thereby the screen mask 31 used for printing of the phosphor materials has apertures 33a of finer pitch. Moreover, the display screen has recently been enlarged and thereby the number of apertures has also increased.

However, it has been difficult in the known screen printing apparatus and method to maintain highly accurate printing using such a finer pitch pattern.

Namely, in the printing method using the screen mask as explained above, printing accuracy can be lowered by size error due to delicate changes in the printing conditions such as squeegee pressure and viscosity of the phosphor material paste, or by a change in the printing position due to expansion and compression of the screen itself depending on the number of times of use or the passage of time.

Lowered printing accuracy causes, in the case of the fine pattern, a shortage in the amount of phosphor material paste to be supplied to the grooves between the separation walls and, moreover, excessively lowered printing accuracy will generate serious defects such as printing to an unwanted area, for example, of the red phosphor material, when the green phosphor material was intended.

A size error depending on the printing condition may be controlled to a certain degree by predicting the printing condition at the time of mask design. Therefore, generation of serious defects as explained above can be prevented, but there is a limit to the number of times of use of the mask, and replacement of the mask is required when an error is generated.

In addition, since a longer time is required for the design of the screen mask, even if a designer is a skilled person, change of the mask pattern because of generation of size error or change of specifications cannot be done easily and, moreover, it is difficult to take an immediate measure.

SUMMARY OF THE INVENTION

It is therefore an object of the present invention to provide a screen printing method and apparatus which can solve the problems of the art explained above, and assure easier design of screen masks and provides an immediate measure of the printing condition, size error due to expansion and compression of the screen or change of specifications by enabling size adjustment of the screen mask.

In view of solving the problems explained above, the present invention provides a screen printing method for printing specified printing materials on a printing surface using a screen which has formed apertures corresponding to a printing pattern, and which extends over a frame. The specified printing materials are printed on the printing surface via the apertures, when the frame is deformed by applying a pressure or a pulling force on a side surface of the frame to reduce or enlarge, respectively, the size of the apertures of the screen.

That is, an external force is applied to the screen fixing frame to compress or enlarge the shape of the screen for the purpose of fine adjustment of the aperture size of the screen. In this way, highly accurate printing may be realized and a change of size of the printing pattern due to the change of printing conditions or specifications can be accommodated very easily. Moreover, the mask can also be designed simply.

DESCRIPTION OF THE PREFERRED EMBODIMENTS

The preferred embodiments of the present invention will now be explained in detail with reference to the accompanying drawings.

Figure 1A:
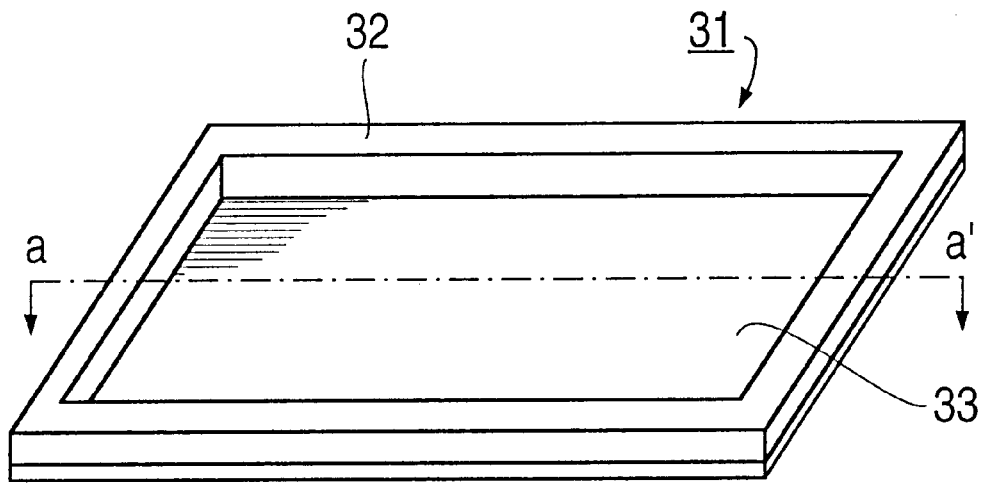
FIG. 1(a) is a perspective view and FIG. 1(b) is a cross sectional view of a conventional screen mask for explaining generally the screen printing method and apparatus.
Figure 1B:
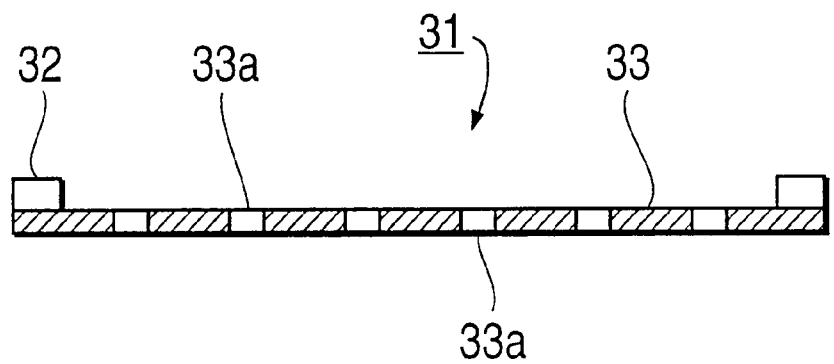
Figure 2:
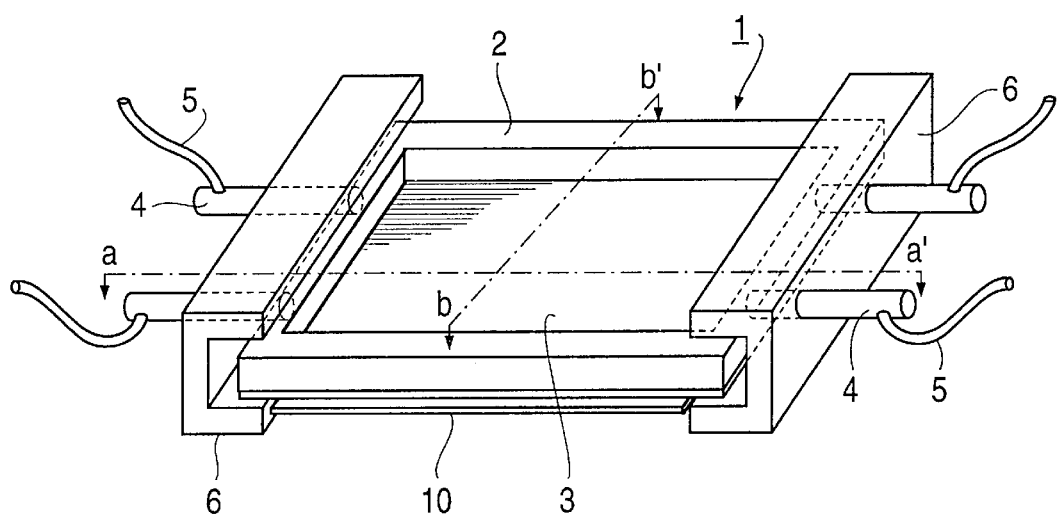
FIG. 2 is a perspective view of the screen mask for explaining the first embodiment of the present invention.
Figure 3:
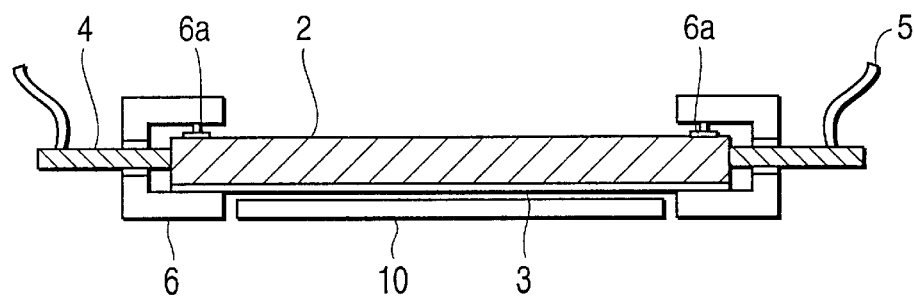
FIG. 3 is a cross-sectional view of the screen mask shown in FIG. 2 taken along line a–a' thereof for explaining the first embodiment of the present invention.
Figure 4:
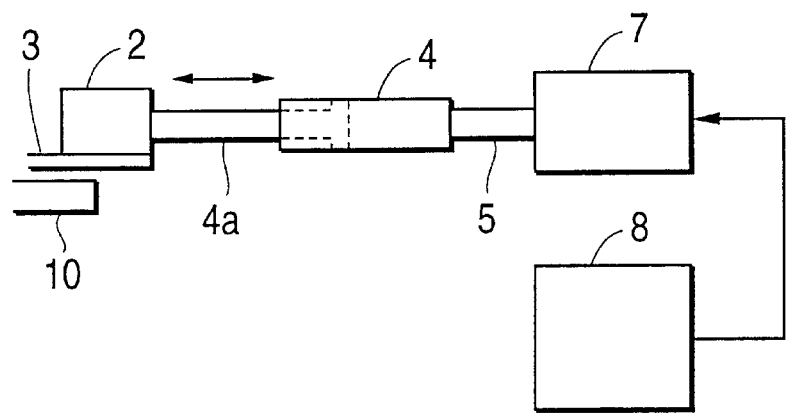
FIG. 4 is a schematic diagram for explaining the application of pressure to the frame in relation to the first embodiment of the present invention.

FIG. 2 is a perspective view of a screen mask and a pressure applying device for explaining a first embodiment of the present invention. FIG. 3 is a cross-sectional view thereof. FIG. 4 shows details of the device for applying pressure to the frame.

A screen mask 1 is composed, as shown in FIGS. 2 and 3, of an aluminum rectangular screen fixing frame (hereinafter referred to as frame) 2 and a screen 3 which is connected to and supported by the frame with a predetermined tension.

The frame 2 is supported, as will be explained later, by a mask supporting body 6 during printing, and receives a pressure which is predetermined based on the printing conditions and the number of times of use (number of times of printing) from a pressure applying device described below. The screen 3 is formed by coating a stainless metal mesh with emulsion, and the area not coated with emulsion becomes the apertures corresponding to the printing pattern. The apertures will be explained in detail with reference to FIGS. 6 and 7.

The mask supporting body 6 is arranged to support two opposing frame sides, and incorporates a frame fixing member 6a adjustable in the vertical direction. The fixing member 6a pushes on the angled corner portions of the frame 2, and these angled corner portions may be fixed to the mask supporting body 6 by adjusting the fixing member 6a upwardly or downwardly. Fixing of the frame is performed after the adjustment of the size of the printing pattern of the screen 3 using an air cylinder 4.

The pressure applying air cylinder 4 is arranged through a side wall of the mask supporting body 6 on two opposing frame sides. The air is supplied and evacuated via an air supply pipe 5. In more detail, by referring to FIG. 4, the air cylinder 4 has a piston rod 4a which can be moved in the direction of the arrow and an end of the rod contacts the side surface of the frame 2 to adjust a pressing force depending on the air pressure.

The pressing force of the piston rod 4a of the air cylinder applies a pressure to the side of the frame 2. The side is thereby deformed toward the inside of the frame and thereby the size of an external shape (pattern) of the apertures of the screen 3 is reduced.

Adjustment of the air pressure is realized by a mass flow controller 7 which controls the supply and evacuation of air. The mass flow controller 7 is controlled by a control apparatus 8. The latest information such as printing pattern size and printing condition is previously input to this control apparatus 8.

The air cylinder 4 can also be arranged on all sides of the rectangular frame 2. In this way, finer adjustment can be obtained.

Next, an embodiment for printing phosphor materials to a PDP having a 42 inch diagonal length will be explained with reference to FIGS. 5 to 7.

Figure 5A:
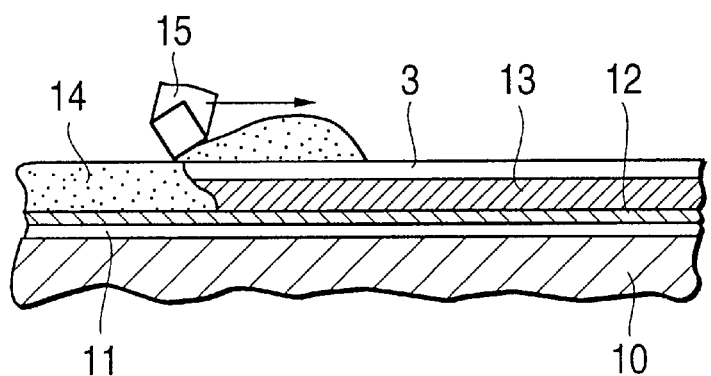
FIGS. 5(a) and (b) are cross-sectional detailed views for explaining a printing process according to the present invention taken along lines b—b' and a—a', respectively, of FIG. 2.
Figure 5B:
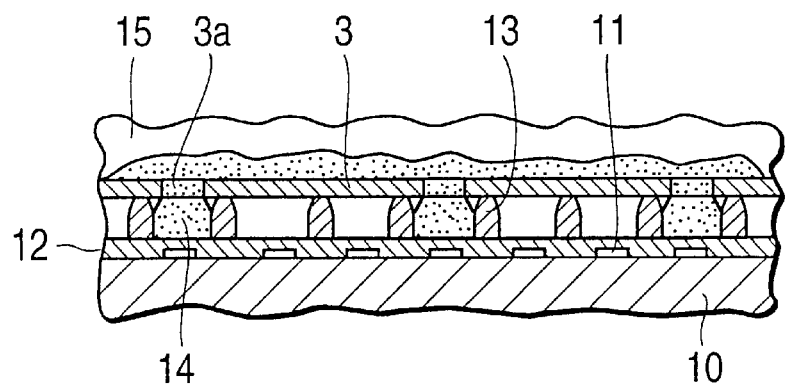

First, the PDP substrate 10 is carried on a stage of a printing apparatus (not illustrated). The stage loading the PDP substrate 10 is moved upward and is positioned to be almost in contact with the screen mask 1. FIG. 5a is a cross-sectional view showing this condition, and corresponds to the cross-sectional view indicated by the dotted line b–b' of FIG. 2. FIG. 5(b) corresponds to the cross-sectional view indicated by the dotted line a–a' of FIG. 2.

In the PDP substrate, an address electrode 11 and a dielectric material layer 12 covering the address electrode 11 are formed on the glass substrate 10 and a separation wall or stripe 13 is also formed on the dielectric material layer to sandwich the address electrode 11.

Since 1920 grooves are formed by 1921 separation walls in this PDP substrate, a phosphor material paste 14 of red (R), green (G) and blue (B) is printed respectively in 640 (1920/3) grooves. Therefore, the positioning between the screen mask 1 and the PDP substrate 10 is executed for matching between the apertures 3a of the screen 3 and the grooves between the separation walls 13. In this case, according to the present invention, the predetermined pressure is applied to the frame 2 of the screen mask 1 by the air cylinder 4 explained above. This pressure application is sustained until the end of the printing of the phosphor materials of the predetermined colors.

When the pressure is being applied, the phosphor material paste 14 of red color, for example, is supplied as shown in FIG. 5(a) on the screen 3 and a squeegee 15 is moved on the screen 3. Thereby, the phosphor material paste is pushed out of the apertures 3a, and the groove between the predetermined separation walls 13 on the glass substrate 10 is filled with the phosphor material paste 14. In this case, as will be understood from FIG. 5(b), since the aperture 3a of the screen 3 is formed in every other pitch of the separation wall 13, the relevant phosphor material past 14 of red color is supplied to the groove every three pitches.

After the phosphor material paste of red color is printed as explained above, the phosphor material pastes 14 of green and blue colors are sequentially supplied to the adjacent grooves between the separation walls 13 isolated by one pitch respectively using the screen 3 having the apertures 3a deviated by one pitch. The printed phosphor material pastes of red, green and blue colors are dried and then baked at a temperature of about 500° C. to evaporate vehicle included in the paste. Thereby, the phosphor material is deposited, although not illustrated, in the groove between the separation walls 13, namely on the surface of the dielectric material layer 12, on the address electrode 11, and the side surfaces of the opposing separation walls 13.

Change of the printing pattern size, when using the pressure application of this embodiment, will now be explained.

Figure 6:
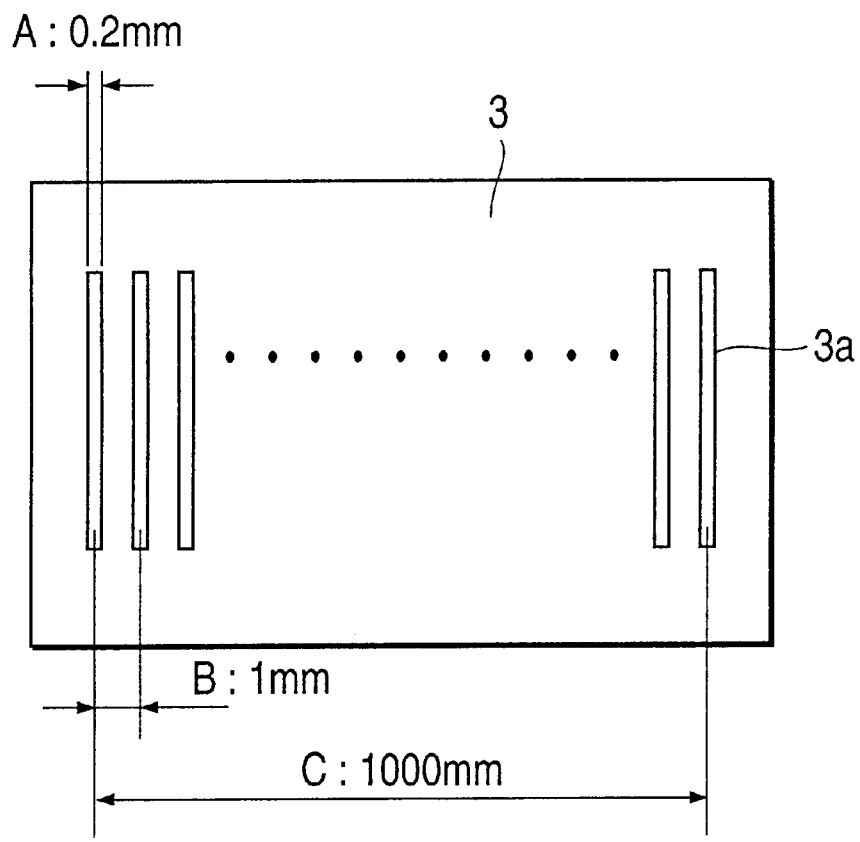
FIG. 6 is a plan view of the screen used in the first embodiment of the present invention.
Figure 7A:
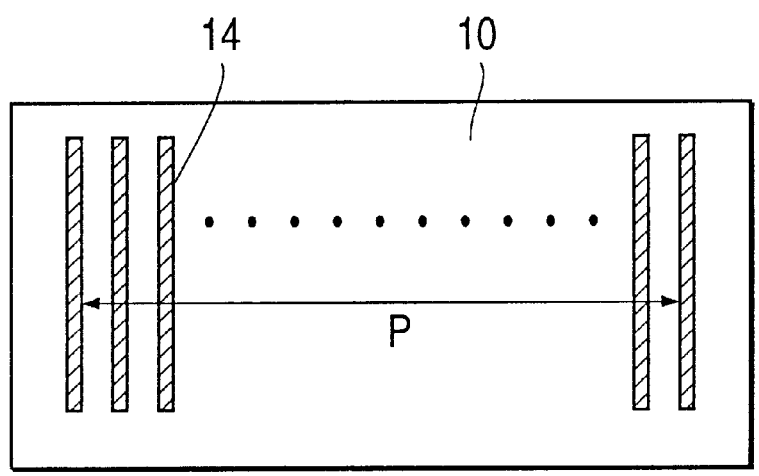
FIG. 7(a) is a plan view of a glass substrate on which the phosphor material paste is printed.

FIG. 6 is a plan view of the screen 3 used in this embodiment, indicating the relationship between the size and pitch of the aperture stripes 3a. FIG. 7(a) is a plan view of the glass substrate 10 on which the phosphor material paste 14 is actually printed, and FIG. 7(b) is a graph showing change of printing size due to a change in pressure.

As shown in FIG. 6, this embodiment uses the screen 3 having 640 aperture stripes 3a in the width A of 0.2 mm, the pitch B of 1 mm and the total pitch C of 1000 mm.

FIG. 7(a) shows the condition where the phosphor material paste 14 is actually printed using such a screen 3.

Figure 7B:
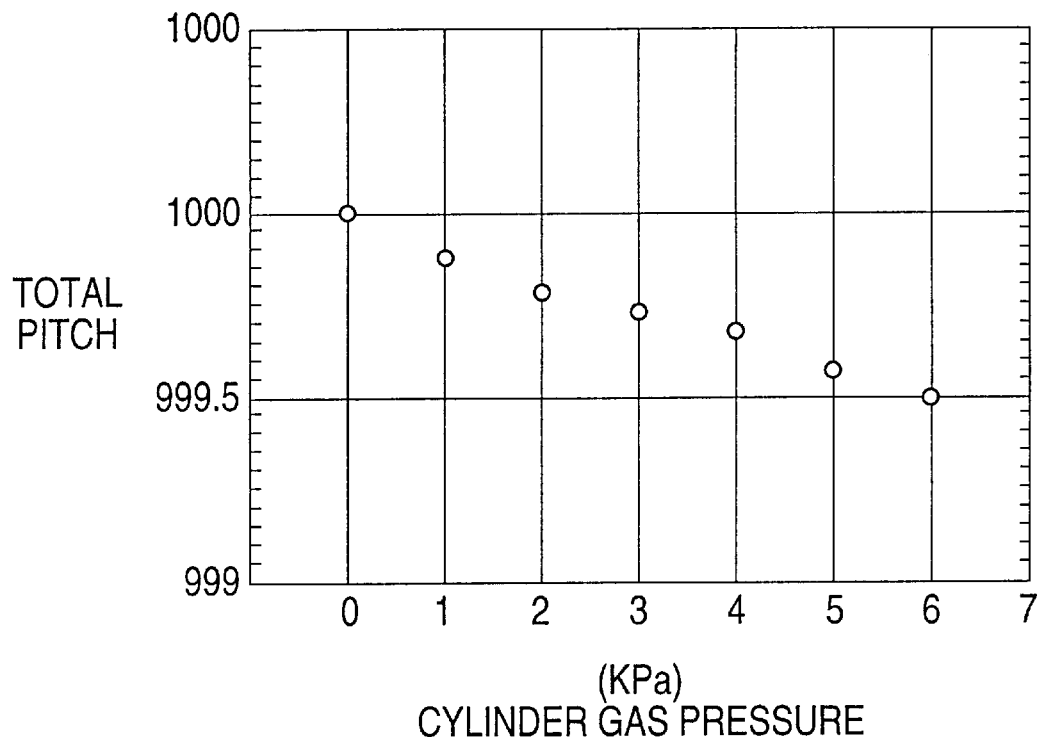
FIG. 7(b) is a graph showing a change of the pitch relative to pressure according to the present invention.

Moreover, FIG. 7(b) shows the result of measurement where change of the total pitch P in the substrate 10 area near the center is measured setting the air pressure of the cylinder as a parameter.

Air pressure of the cylinder is applied to the air cylinder 4 by the mass flow controller of FIG. 4 and the unit thereof is expressed by Kilo Pascal (KPa). In this embodiment, the air cylinder 4 is provided at four positions and equal pressure is applied thereto.

When the cylinder air pressure is changed from 0 to 6 (KPa) for use of the screen where the total pitch C of the apertures 3a is set to 1000 mm, the total pitch P of the printed phosphor material paste 14 has changed within the range of 0.5 mm, as shown in FIG. 7(b), almost in proportion to the air pressure.

Therefore, the size of the phosphor material paste to be printed can be controlled depending on the air pressure applied to the air cylinder 4 to easily cover the change of specifications and conditions of the screen mask 3 itself.

As a result of the printing of the phosphor material paste by executing the adjustment of air pressure, it has been verified that width A and pitch B of a plurality of aperture stripes 3a is equally changed and any fluctuation of size in the screen surface is not generated.

Next, an extension example and a modification example of the present invention will be explained.

First, the second embodiment of the present invention. corresponding to the extension example will be explained.

Figure 8:
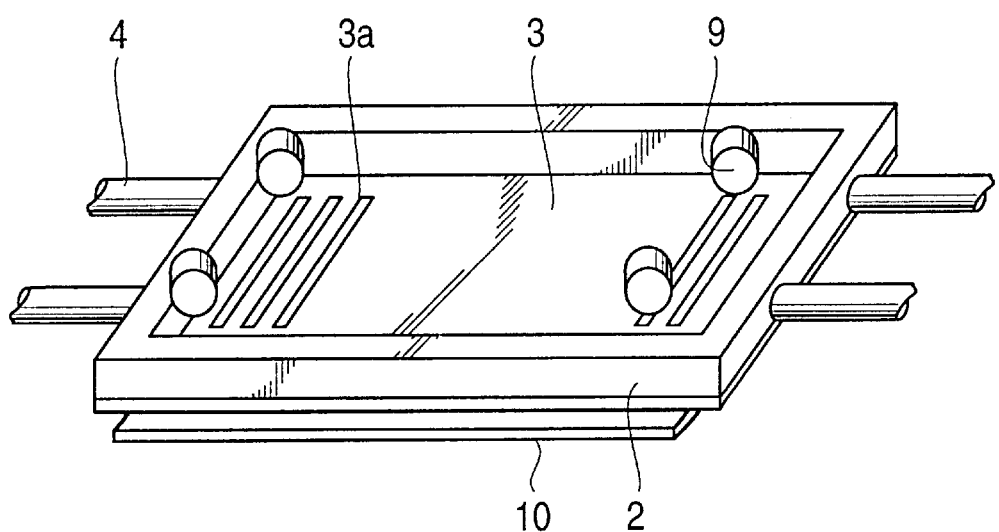
FIG. 8 is a perspective view of the screen mask according to a second embodiment of the present invention.

FIG. 8 is a perspective view of the screen mask in relation to the second embodiment, wherein the same elements as those in the first embodiment are designated by the same reference numerals.

This second embodiment is different from the first embodiment in that a CCD camera 9 is provided. Namely, a CCD camera 9 is arranged at the areas corresponding to the four corners of the screen 3 and the total pitch C of the apertures 3a is always detected by detecting the position of the left end aperture 3a and the right end aperture 3a of the screen.

Air pressure of the air cylinder 4 is controlled on the basis of this detection result. For example, a pressure to the frame 2 is adjusted by controlling the mass flow controller 7, considering the total pitch C detection result by the CCD camera 9 as one of the conditions input to the control apparatus 8 shown in FIG. 4.

In this second embodiment, an adequate value of the total pitch C of the apertures 3a is preset from the pitch P of the printing object portion on the substrate 10 and the air cylinder 4 is operated when the total pitch deviates from the adequate value in the total pitch detection result by the CCD camera 9 in order to execute the fine adjustment of the aperture size of the screen 3.

As explained above, according to the second embodiment in which the condition (expansion, etc. by elongation of the screen). of the apertures 3a of the screen is detected and a pressure is applied to the frame depending on the result of the detection, size error of the apertures 3a due to the change by aging of the screen 3 can be prevented and size accuracy of the phosphor material to be printed actually can be enhanced.

In the second embodiment, the total pitch is detected in a couple of positions of the apertures 3a and size adjustment is performed by the air cylinder 4 at the respective positions. Thereby, size fluctuation due to positional differences in the longitudinal direction of the apertures 3a can be measured.

Moreover, although not illustrated, it is also possible to enhance the printing accuracy by providing a device (the CCD camera, for example) for detecting the size of an external shape (pattern) of the phosphor material to be printed on the glass substrate 10 to adjust a pressure applied to the frame 2 depending on the detection result and moreover by detecting both pattern size of the phosphor material printed actually and pattern size of the apertures 3a of the screen 3 to adjust a pressure applied to the frame 2 depending on the detection result.

Figure 9A:
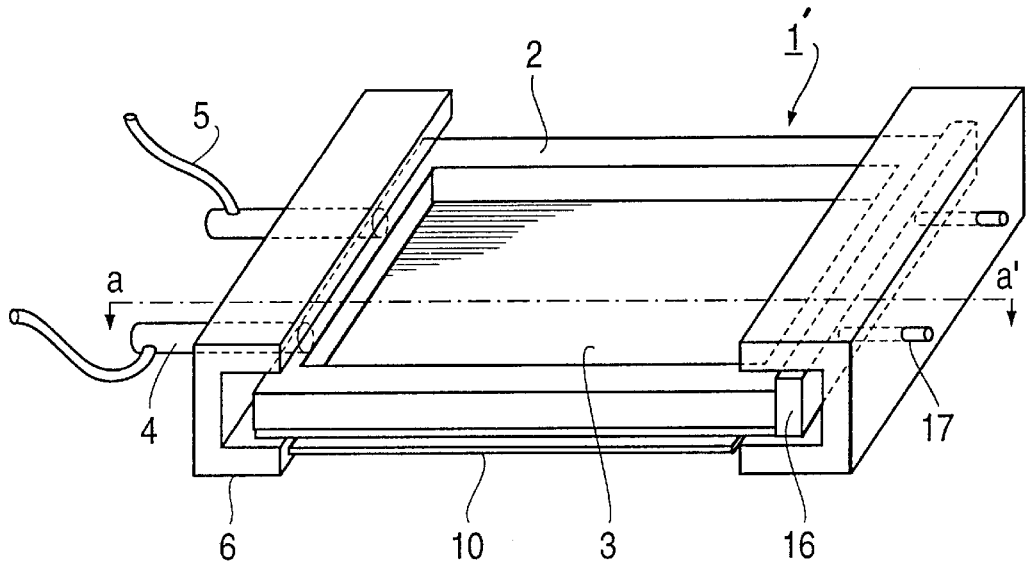
FIG. 9(a) is a perspective view and a FIG. 9(b) is a cross-sectional view of the screen mask according to a third embodiment of the present invention.
Figure 9B:
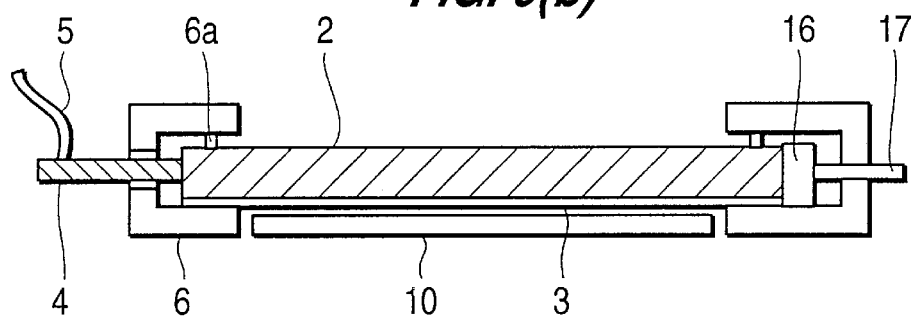

FIGS. 9(a) and (b) show a screen mask of the third embodiment corresponding to an extension example of the present invention. FIG. 9(a) is a perspective view and FIG. 9(b) is a cross-sectional view. In this third embodiment, the same elements as those in the first embodiment are designated by the same reference numerals.

The difference in structure of the third embodiment from that of the first embodiment is that an air cylinder 4 is provided only on one side of the frame 2 and the opposing side is provided with a contact block 16. The contact block 16 is placed in contact with the entire surface of this side of the frame 2, enabling change of stroke by means of a screw type pressure applying pin 17.

Therefore, the screen mask 1' allows that the aperture size may be fine adjusted in the screen 3 by applying a pressure to the frame 2 by the air cylinder 4, from the side opposite the one where the frame 2 contacts the block 16.

According to the third embodiment, since an entire side of the frame 2 is supported by the contact block 16, a pressure is not applied to only a portion of the frame 2 but the pressure is equally applied to the frame. Therefore, higher accurate adjustment can be realized.

Next, a modification example of the present invention will be explained.

Figure 10:
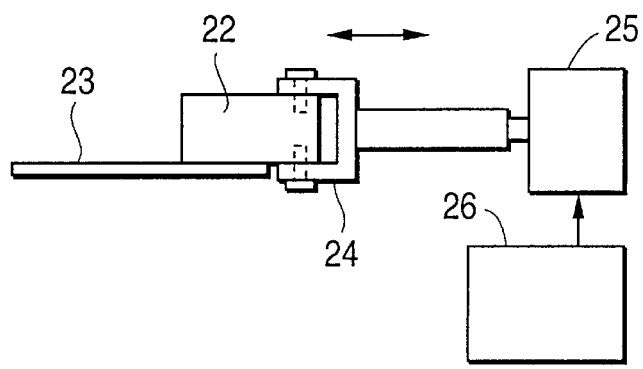
FIG. 10 is a diagram for explaining another embodiment for applying pressure to the frame according to the present invention.

FIG. 10 is a diagram for explaining another example of the device for applying pressure to the frame. The pressure applying device shown in FIG. 10 includes a holding member 24 which is fixed to an end part of a frame 22 supporting a screen 23, and which is moved by a driving source 25 such as a motor.

Since the pressure applying device is holding the frame 22, the device can apply a pressure in such a direction as pulling the frame 22 outward, while the pressure applying device of FIG. 4 moves the frame inward thereby reducing the size of the frame.

Therefore, the original size of the apertures of the screen 23 can be expanded and thereby the range for changing the size of apertures may be widened.

The control apparatus 26 controls the driving source 25 depending on the various conditions input as in the case of the control apparatus 8 explained in regard to FIG. 4.

In the embodiments explained above, a pressure applying device such as an air cylinder is provided for at least one frame side, but the setting position and quantity thereof may be adequately selected depending on the changing direction of the pattern size, etc., and are not limited thereto.

Moreover, the present invention is particularly effective for printing of a fine pattern and is not limited only to the printing of phosphor material in a PDP. For example, the present invention can also be applied to formation of the separation wall of a PDP and formation of a conductor for wiring of a printed circuit board.

According to the screen printing method and screen printing apparatus of the present invention, the screen may be expanded or contracted to enable fine adjustment of the pattern in the screen by applying a pressure to the frame supporting the screen. Thereby, highly accurate printing can be realized, change of pattern size due to change of the printing conditions or change of specifications may also be realized easily and the mask can be designed easily. In addition, the present invention provides excellent practical benefits, such as a simple structure which requires only adding the pressure applying device, and excellent working capability.

We claim:

1. A method using apertures on a screen attached to a planar frame, said apertures corresponding to a precise, repeated uniform pattern, to apply a material to a surface of a substrate positioned adjacent the screen, comprising the steps of:

providing a body to support the frame on first and second opposing sides only;

fixing a portion of the frame using members attached to the body and movable perpendicular to the plane of the frame;

deforming the frame by using the body to apply pressure co-planar to the frame to change a size of said apertures; and applying said material to said substrate surface via said apertures, wherein the deforming step comprises the step of applying a mechanical force from outside the frame inwardly against an exterior of the first side of the frame to cause the first side to move inwardly.

2. The method according to claim 1, further comprising, after the deforming step, the step of changing the external force applied to the first side.

3. A method using apertures on a screen attached to a frame having a plurality of sides, said apertures corresponding to a precise, repeated uniform pattern, to apply a material to a surface of a substrate positioned adjacent the screen, comprising the steps of:

providing a body to support the frame on first and second opposing sides only;

fixing a portion of the frame using members attached to the body and movable perpendicular to the plane of the frame;

deforming the frame by using the body to apply pressure co-planar to the frame to change a size of said apertures; and applying said material to said substrate surface via said apertures, wherein the deforming step comprises the step of applying a mechanical force from outside the frame outwardly against an exterior of the first side of the frame to cause the first side to move outwardly.

4. The method according to claim 3, further comprising, after the deforming step, the step of changing the external force applied to the first side.

5. A screen printing method for forming a plurality of parallel printed stripes on a printing surface by utilizing a screen mask which is formed by extending a screen having a plurality of apertures forming parallel aperture stripes on a planar frame having a plurality of sides, comprising the steps of:

providing a body co-planar with the frame to support the frame on first and second opposing sides only;

mechanically deforming the frame by using the body to apply an outward external force to at least one of said first and second sides of the frame, said at least one of said first and second sides being parallel to said aperture stripes, to deform the at least one of said first and second sides outwardly and thereby increase a total pitch of the aperture stripes;

fixing a portion of the frame using members attached to the body and movable perpendicular to the plane of the frame; and applying the printing materials to the printing surface via the apertures.

6. The method according to claim 5, further comprising, after the deforming step, the step of changing the external force applied to the at least one first and second sides.

7. A screen printing method for forming a plurality of parallel printed stripes on a printing surface by utilizing a screen mask which is formed by extending a screen having a plurality of apertures forming parallel aperture stripes on a planar frame having a plurality of sides, comprising the steps of:

providing a body co-planar with the frame for supporting the frame on first and second opposing sides only;

fixing a portion of the frame using members attached to the body and movable perpendicular to the plane of the frame;

deforming the frame by using the body to apply a mechanical force from outside the frame inwardly and co-planar with the plane of the frame to an exterior of at least one of the first and second sides of the frame, said at least one of the first and second sides being parallel to the aperture stripes, to deform the at least one first and second sides inwardly and thereby reduce a total pitch of the aperture stripes; and applying the printing materials, during the deforming step, to the printing surface via the apertures.

8. The method according to claim 7, further comprising, after the deforming step, the step of changing the external force applied to the at least one of the first and second sides.

9. An apparatus for coating a surface with a material by causing the material to pass through apertures, comprising:

a planar screen having apertures corresponding to a precise, repeated uniform pattern;

a frame having a plurality of sides and supporting said screen with a predetermined tension;

a body for supporting the frame on first and second opposing sides only, the body including a device for applying a mechanical force from outside the frame to an exterior of the first and second sides of the frame, co-planar with the frame, to change an orientation of the apertures; and members attached to the body and movable perpendicular to the plane of the frame to fix a portion of the frame.

10. The apparatus according to claim 9, wherein the pressure applying device includes two pairs of air cylinders to individually apply pressure to the first side and the second opposing frame side.

11. The apparatus according to claim 9, further comprising a device for detecting a total pitch of the apertures to control the pressure of said pressure applying device depending on the pitch detected.

12. The apparatus as recited in claims 11, wherein the detecting device includes a camera arranged adjacent the screen.

13. An apparatus for coating a surface with a material by causing the material to pass through apertures, comprising:

a planar screen having apertures corresponding to a pattern;

a frame having a plurality of sides and supporting said screen with a predetermined tension; and a body for supporting the frame on first and second opposing sides only, the body including a device for mechanically applying pressure to the first and second sides of the frame, co-planar with the frame, to change an orientation of the apertures, wherein said pressure applying device includes a block which contacts the first side and an air cylinder for applying pressure to the second frame side, in opposition thereto.

14. A screen apparatus for filling grooves, formed between a plurality of separation walls which are provided in parallel on a substrate, with phosphor material, comprising:

a screen having a plurality of aperture stripes corresponding to a shape of said grooves;

a planar rectangular screen fixing frame having a plurality of sides and supporting said screen with a predetermined tension;

a body co-planar with the frame for supporting the frame on first and second opposing sides only, the body including a device for mechanically applying pressure to at least one of the first and second sides, co-planar with the frame, each of which first and second sides is parallel to said aperture stripes, wherein said body deforms, with the pressure, said at least one first and second sides inwardly to reduce a pitch of the aperture stripes until the total pitch of said aperture stripes matches a total pitch of said grooves; and members attached to the body and movable perpendicular to the plane of the frame to fix a portion of the frame.

15. The apparatus according to claim 14, wherein the pressure applying device includes two pairs of air cylinders to individually apply pressure to the first and second sides, respectively.

16. The apparatus according to claim 14, wherein the pressure applying device includes a block which contacts the first side and an air cylinder for applying the pressure to the second frame side in opposition thereto.

17. The apparatus according to claim 16, wherein the block comprises a pin for adjusting the block.

18. The apparatus according to claim 14, further comprising a device for detecting a total pitch of the aperture stripes to control the pressure of said pressure applying device depending on the total pitch detected.

19. The apparatus as recited in claim 18, wherein the detecting device includes a camera arranged adjacent the screen.

20. The apparatus as recited in claim 19, wherein the camera is positioned at corners of the rectangular frame.

21. The apparatus according to claim 14, wherein the pressure applying device is an arms, connected to the first side of the frame, for movement toward and away from the frame.

22. The apparatus as recited in claim 14, wherein the body comprises a plurality of air cylinders, and each air cylinder contacts a respective one of the plurality of sides.

23. An apparatus for coating a surface with a material by causing the material to pass through apertures, comprising:

a screen having apertures corresponding to a pattern;

a frame supporting said screen with a predetermined tension; and a device for applying pressure to a side of the frame to change an orientation of the apertures, wherein said pressure applying device includes a block which contacts the side and an air cylinder for applying pressure to another of the frame sides, in opposition thereto.

24. The apparatus as recited in claim 23, wherein the block includes a pin for adjusting the block.

25. The apparatus according to claim 23, further comprising a device for detecting a total pitch of the apertures to control the pressure of said pressure applying device depending on the pitch detected.

26. The apparatus as recited in claim 25, wherein the detecting device includes a camera arranged adjacent the screen.

27. The apparatus as recited in claim 26, wherein the camera is positioned at corners of the frame.

28. A screen apparatus for filling grooves, formed between a plurality of separation walls which are provided in parallel on a substrate, with phosphor material, comprising:

a screen having a plurality of aperture stripes corresponding to a shape of said grooves;

a rectangular screen fixing frame supporting said screen with a predetermined tension; and a device for applying pressure to at least one side surface of a pair of frame sides, each of which sides is parallel to said aperture stripes, wherein said pressure applying device deforms, with the pressure, said at least one side inwardly to reduce a pitch of the aperture stripes until the total pitch of said aperture stripes matches a total pitch of said grooves, and wherein said pressure applying device includes a block which contacts the at least one frame side and an air cylinder for applying the pressure to another of the at least one frame side in opposition thereto.

29. The apparatus according to claim 28, wherein the block includes a pin for adjusting the block.

30. The apparatus according to claim 28, further comprising a device for detecting a total pitch of the aperture stripes to control the pressure of said pressure applying device depending on the total pitch detected.

31. A screen apparatus for filling grooves, formed between a plurality of separation walls which are provided in parallel on a substrate, with phosphor material, comprising:

a screen having a plurality of aperture stripes corresponding to a shape of said grooves;

a rectangular screen fixing frame supporting said screen with a predetermined tension;

a device for applying pressure to at least one side surface of a pair of frame sides, each of which sides is parallel to said aperture stripes, wherein said pressure applying device deforms, with the pressure, said at least one side inwardly to reduce a pitch of the aperture stripes until the total pitch of said aperture stripes matches a total pitch of said grooves, wherein said pressure applying device includes a block which contacts the at least one frame side and an air cylinder for applying the pressure to another of the at least one frame side in opposition thereto; and a device for detecting a total pitch of the aperture stripes to control the pressure of said pressure applying device depending on the total pitch detected, wherein the detecting device includes a camera arranged adjacent the screen.

32. The apparatus as recited in claim 31, wherein the camera is positioned at corners of the rectangular frame.

33. A screen apparatus for filling grooves, formed between a plurality of separation walls which are provided in parallel on a substrate, with phosphor material, comprising:
- a screen having a plurality of aperture stripes corresponding to a shape of said grooves;
- a rectangular screen fixing frame supporting said screen with a predetermined tension; and
- a device for applying pressure to at least one side surface of a pair of frame sides, each of which sides is parallel to said aperture stripes,
- wherein said pressure applying device deforms, with the pressure, said at least one side outwardly to increase a pitch of the aperture stripes until the total pitch of said aperture stripes matches total pitch of said grooves, and wherein said pressure applying device includes a block which contacts the at least one frame side and an air cylinder for applying the pressure to another of the at least one frame side in opposition thereto.

34. The apparatus according to claim 33, wherein the block comprises a pin for adjusting the block.

35. The apparatus according to claim 33, further comprising a device for detecting a total pitch of the aperture stripes to control the pressure of said pressure applying device depending on the total pitch detected.

36. The apparatus as recited in claim 35, wherein the detecting device includes a camera arranged adjacent the screen.

37. The apparatus as recited in claim 36, wherein the camera is positioned at corners of the rectangular frame.

* * * * *